US009589654B2

(12) United States Patent
Ma et al.

(10) Patent No.: US 9,589,654 B2
(45) Date of Patent: Mar. 7, 2017

(54) RANK DETERMINATION OF CIRCUITS WITH DISTINCT CURRENT CARRYING CAPABILITIES

(71) Applicant: Empire Technology Development LLC, Wilmington, DE (US)

(72) Inventors: Yanjun Ma, Bellevue, WA (US); Edwin Kan, Ithaca, NY (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 0 days.

(21) Appl. No.: 14/647,075

(22) PCT Filed: Apr. 15, 2014

(86) PCT No.: PCT/US2014/034172
§ 371 (c)(1),
(2) Date: May 22, 2015

(87) PCT Pub. No.: WO2015/160330
PCT Pub. Date: Oct. 22, 2015

(65) Prior Publication Data
US 2016/0049205 A1    Feb. 18, 2016

(51) Int. Cl.
*G11C 16/04* (2006.01)
*G11C 16/26* (2006.01)
(Continued)

(52) U.S. Cl.
CPC ............... *G11C 16/26* (2013.01); *G11C 7/08* (2013.01); *G11C 7/1006* (2013.01); *G11C 11/54* (2013.01);
(Continued)

(58) Field of Classification Search
CPC ......... G11C 16/26; G11C 16/32; G11C 16/24; G11C 11/54; G11C 13/004; G11C 11/56;
(Continued)

(56) References Cited

U.S. PATENT DOCUMENTS 7,391,646 B2 *   6/2008   Cernea ................... G11C 16/08
                                                 365/185.03
7,499,327 B2 *   3/2009   Kwak ................ G11C 16/0483
                                                 365/185.17
(Continued)

FOREIGN PATENT DOCUMENTS

| WO | 0109871 A1 | 2/2001 | |
| WO | WO0109871 | * 2/2001 | ............... G09G 3/36 |
| WO | WO 0109871 | * 2/2001 | |

OTHER PUBLICATIONS

Kim, M., et al "Rank Modulation Hardware for flash Meories" IEEE 55th International Midwest Symposium on Circuits and Systems (MWSCAS), pp. 294-297 (Aug. 5-8, 2012).*
(Continued)

*Primary Examiner* — Tha-O H Bui
(74) *Attorney, Agent, or Firm* — Turk IP Law, LLC (57) ABSTRACT

Technologies are generally provided for methods and circuitry to rank a large number of cells in a timeframe of about one sense cycle. In some examples, an architecture may be implemented to rank memory cells such as volatile memories, non-volatile memories, and other types of data storage devices, where there may not be an equivalent to threshold voltage. In other examples, an arbitrary group of circuits, such as in neural networks where there may not be an equivalent control gate to set the timing resolution, may be ranked. Relative sense timing may be used to rank the cells having different current carrying abilities. A ramped gate voltage may be used to control the timing resolution and to
(Continued)

reduce contention between close separate cells. Digital logic may be used to latch and/or record the rank information.

16 Claims, 7 Drawing Sheets (51) Int. Cl.
G11C 7/08 (2006.01)
G11C 7/10 (2006.01)
G11C 11/54 (2006.01)
G11C 11/56 (2006.01)
G11C 13/00 (2006.01)
G11C 16/24 (2006.01)
G11C 16/32 (2006.01)

(52) U.S. Cl.
CPC .......... *G11C 11/56* (2013.01); *G11C 11/5621* (2013.01); *G11C 11/5642* (2013.01); *G11C 11/5678* (2013.01); *G11C 13/004* (2013.01); *G11C 13/0061* (2013.01); *G11C 16/24* (2013.01); *G11C 16/32* (2013.01); *G11C 16/0483* (2013.01); *G11C 2211/5648* (2013.01)

(58) Field of Classification Search
CPC ............ G11C 11/5678; G11C 13/0061; G11C 11/5642; G11C 11/5621; G11C 7/1006; G11C 7/08; G11C 2211/5648; G11C 16/0483

USPC ............ 365/185.11, 185.04, 185.21, 185.25
See application file for complete search history.

(56) References Cited

U.S. PATENT DOCUMENTS

| 8,456,919 B1 | 6/2013 | Jeon et al. |
| 2009/0132758 A1 | 5/2009 | Jiang et al. |
| 2014/0063215 A1* | 3/2014 | Miura .................. A61B 1/0002 348/65 |
| 2014/0063915 A1* | 3/2014 | Cronie ................ G11C 7/1006 365/149 |

OTHER PUBLICATIONS

Kim, M., et al "Rank Modulation Hardware for flash Memories" IEEE 55th International Midwest Symposium on Circuits and Systems (MWSCAS), pp. 294-297 (Aug. 5-8, 2012).*
International Search Report and Written Opinion for International Patent Application No. PCT/US2014/034172 mailed Sep. 15, 2014.
Jiang, A., et al., "Rank Modulation for Flash Memories," IEEE Transactions on Information Theory, vol. 55, No. 6, pp. 2659-2673 (Jun. 2009).
Kim, M., et al., "Rank Modulation Hardware for Flash Memories," IEEE 55th International Midwest Symposium on Circuits and Systems (MWSCAS), pp. 294-297 (Aug. 5-8, 2012).

* cited by examiner

RANK DETERMINATION OF CIRCUITS WITH DISTINCT CURRENT CARRYING CAPABILITIES

CROSS-REFERENCE TO RELATED APPLICATION

This Application is the U.S. National Stage filing under 35 U.S.C §371 of PCT Application No. PCT/US14/34172 filed on Apr. 15, 2014. The PCT Application is herein incorporated by reference in its entirety.

BACKGROUND

Unless otherwise indicated herein, the materials described in this section are not prior art to the claims in this application and are not admitted to be prior art by inclusion in this section.

Rank modulation is a scheme that uses the relative order of cell levels to represent data. Rank modulation may be implemented in flash memories, phase-change memories, and other circuits. A challenge with rank modulation for multilevel flash memory is that to be competitive with standard multilevel flash memories, large number of cells may need to be grouped into sets and ranked together. For example to replace a 3 bit/cell NAND flash memory in terms of storage density, sets of 20 cells or more may have to be used. To rank N cells, a conventional algorithm may include approximately N iterations. In each iteration, ranking circuitry may compare a level of all the cells within a set simultaneously and indicate which one has the highest level. Thus, the relatively slow reading (or ranking) process for ranking modulation based flash memory may be an impediment to its implementation.

SUMMARY

The present disclosure generally describes techniques to determine rank of a plurality of circuits such as memory cells.

According to some examples, the present disclosure describes methods to determine rank of a plurality of circuits. An example method may include determining relative sense timing for the plurality of circuits having distinct current carrying capabilities and ranking the plurality of circuits based on the determined relative sense timing for a timing resolution.

The present disclosure also describes rank determination circuitry to determine rank of a plurality of circuits arranged in rows and columns. Example rank determination circuitry may include a current or voltage sense block for each column of the plurality of circuits and a digital block. The sense block may be configured to sense a specific current or voltage level for a respective column of the plurality of circuits. The digital block may be configured to determine relative sense timing for the plurality of circuits through the sense blocks, where each of the plurality of circuits has a distinct current carrying capabilities, set a timing resolution using a particular control voltage for each of the plurality of circuits, and rank the plurality of circuits based on the determined relative sense timing at the set timing resolution.

The present disclosure also describes rank determination circuitry coupled to a matrix of flash memory cells. Example rank determination circuitry may include a sense block coupled to each column of flash memory cells and a digital block coupled to all columns of flash memory cells. The sense block may be configured to sense a specific current or voltage level of a respective column. The digital block may be configured to turn on a reset line to discharge rows of flash memory cells to initiate a determination of a relative sense timing of the flash memory cells, select a row of the flash memory cells through a row decoder to enable current to flow through the flash memory cells in the selected row, determine the relative sense timing based on detection of a fastest rising bit line voltage among columns of flash memory cells, and rank the flash memory cells based on information from the determined relative sense timing for the flash memory cells.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, devices, and/or computer program products related to determine rank of a plurality of circuits such as memory cells.

Briefly stated, technologies are generally provided for methods and circuitry to rank a large number of cells in a timeframe of about one sense cycle. In some examples, an architecture may be implemented to rank memory cells such as volatile memories, non-volatile memories, and other types of data storage devices, where there may not be an equivalent to threshold voltage. In other examples, an arbitrary group of circuits, such as in neural networks where there may not be an equivalent control gate to set the timing resolution, may be ranked. Relative sense timing may be used to rank the cells having different current carrying abilities. A ramped gate voltage may be used to control the timing resolution and to reduce contention between close separate cells. Digital logic may be used to latch and/or record the rank information.

Figure 1:
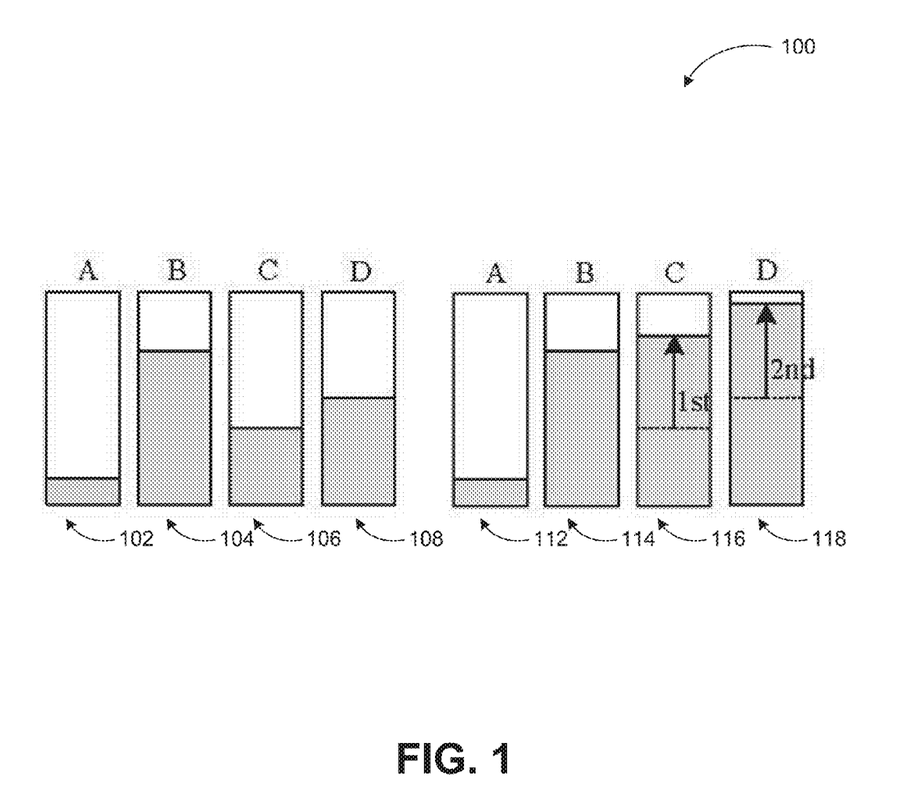
FIG. 1 diagrammatically illustrates an example rank modulation based on relative orders of cell levels.

FIG. 1 diagrammatically illustrates an example rank modulation based on relative orders of cell levels, arranged in accordance with at least some embodiments described herein.

Diagram 100 shows four example memory cells: A 102, B 104, C 106, and D 108 prior to a change in programming, and after programming, where cells A 112 and B 114 preserve their stored content while cells C 116 and D 118 change their stored content. The respective level in each cell, which represents their stored content, may be in the form of a voltage level or charge level, for example, in the cell.

Applying rank modulation to the example cells in diagram 100, an order of the four cells may be (B D C A). Cell B may be the highest programmed level, and cell A may be the lowest. To write a new value, for example, (C B D A), memory cell C may need to be increased beyond B. Likewise, a second write to the same location of the value (D C B A) may need increasing stored value in cell D, as long as there is still enough headroom in the cell(s). In this manner, small changes to stored information or stored values within a block may be performed without copying or erasing the block. Thus, the change of memory content may be faster than conventional encoding, and a lifetime of the memory may be extended by avoiding the high voltages associated with the erasure process.

Rank modulation may also reduce a risk of over-programming. Conventional programming approaches may avoid over-programming by repeatedly injecting small amounts of charge into a cell and measuring the cell's level until the target absolute cell level is achieved. Overshooting the target level may involve erasing the memory block and repeating the programming of the entire block. To avoid such a penalty, writing to multi-level (e.g., greater than four levels) cells may be rather conservative and thus slow. Because rank modulation may not use the absolute values, the memory cells may be safely programmed in a less conservative way, which may lead to substantially faster writing speeds. Flash memories with rank modulation may also tolerate charge leakage better than standard encoding schemes. In flash memories, the cells may lose their charge gradually, resulting in a decrease in their programmed levels. Because the cell levels decrease at relatively similar rate, the absolute values of the cell levels may change substantially faster than the rank order of the cell levels. Thus, conventional encoding schemes may not tolerate charge leakage as well as rank modulation.

Embodiments may be implemented in volatile, non-volatile, and other types of memory devices, as well as various types of circuitry that involve ranking as part of their operation such as neural networks.

Figure 2:
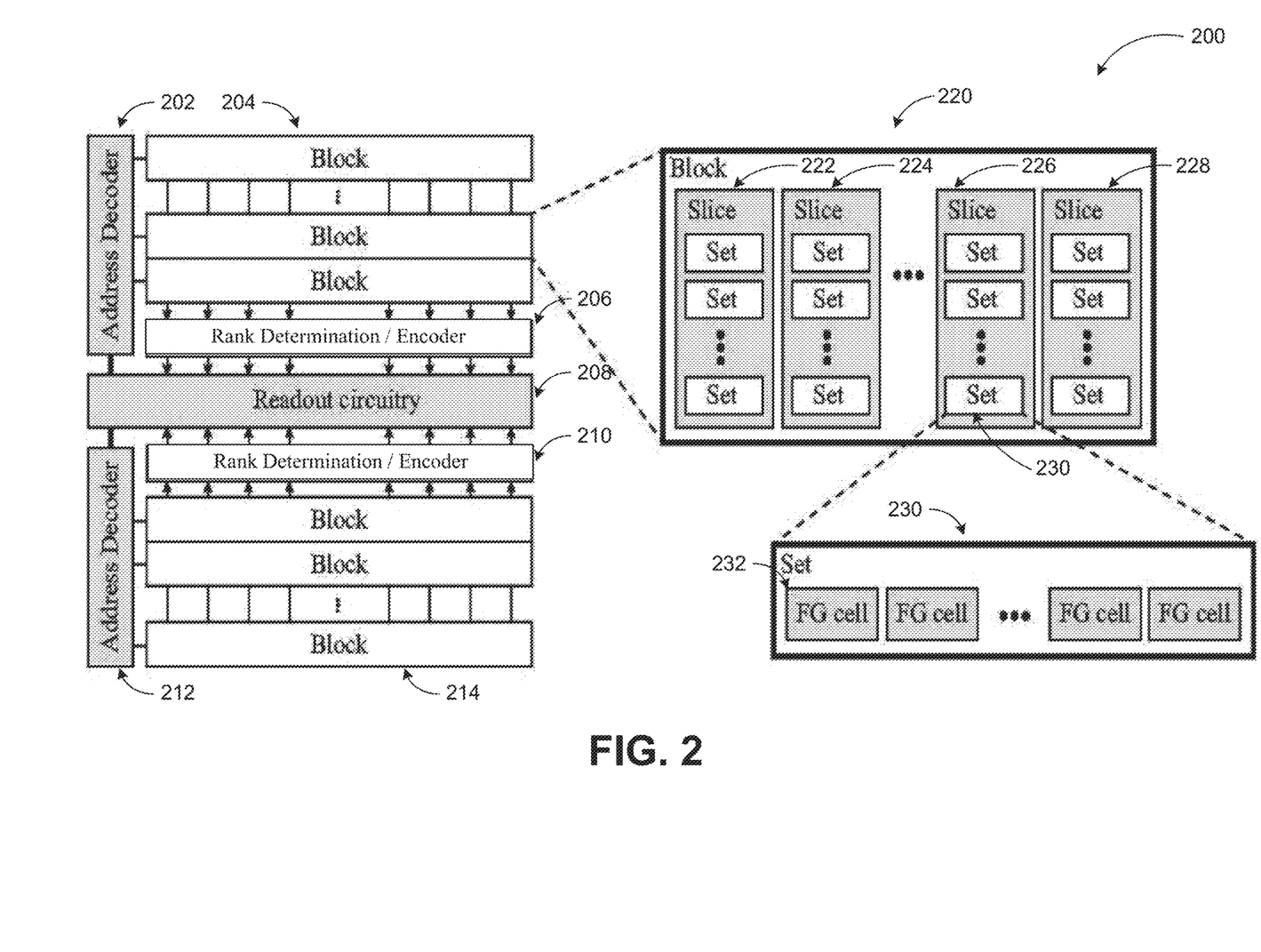
FIG. 2 illustrates an example system architecture for a rank modulation memory, where individual memory blocks may include slices that are a column arrangement of memory sets.

FIG. 2 illustrates an example system architecture for a rank modulation memory, where individual memory blocks may include slices that are a column arrangement of memory sets, arranged in accordance with at least some embodiments described herein.

An example system architecture 200 of FIG. 2 includes blocks of memory cells 204 and 214 arranged above and below a set of encoder circuitry 206, 210 and readout circuitry 208, which in turn may be centrally located relative to the blocks of memory cells 204 and 214. The encoder circuitry 206 and 210 coupled to the blocks of memory cells 204 and 241 may also perform rank determination operations (and are therefore labeled as "Rank Determination/Encoder" elements in FIG. 2). The blocks of memory cells 204 and 214 may be coupled to or otherwise associated with respective address decoders 202 and 212. Architecture 200 also shows a detail view of an example memory cell block 220, which may include slices 222, 224, 226, and 228, where each slice may include multiple memory sets (e.g., set 230). Each set, such as set 230, may include multiple floating gate cells 232. The example architecture 200 is for illustration purposes only and other architectures are possible in other embodiments. A memory architecture or similar circuit architecture with rank determination according to embodiments may be implemented using other configurations, components, and arrangements.

In the example arrangement of the blocks of memory cells in architecture 200, the address decoders 202, 212 may select a single line in the upper and lower halves of the memory to couple to the rank determination circuitry (integrated with the encoder circuitry 206, 210), which may then be encoded and passed along to the readout circuitry 208.

The slices 222, 224, 226, and 228 may be a column arrangement of memory sets. Each set, which may include an array of floating gate (FG) transistor memory cells, may form the primitive unit of the rank modulation memory. The number of FG cells in a set may impact a capacity of rank modulation memories.

According to some example embodiments, rank determination circuitry may include a voltage or a current sense block coupled to each column of memory cells and a digital block coupled to all columns of memory cells. The digital block may turn on a reset line to discharge rows of memory cells to initiate a determination of a relative sense timing of the memory cells, select a row of the memory cells such that current flows to charge the respective columns, a pass voltage may then be applied to all the unselected rows, and determine the relative sense timing based on detection of a fastest rising bit line voltage among columns of memory cells. The digital block of the rank determination circuitry may then rank the memory cells based on relative sense timing information for the memory cells. Alternatively or additionally, the columns may be pre-charged to a preset voltage, a pass voltage may then be applied to all the unselected rows, and the gate voltage of a selected row may be ramped up until the memory cells start to conduct and discharge the columns. The relative timing of the discharge time may be used to rank the order of the memory cell in this set.

Figure 3:
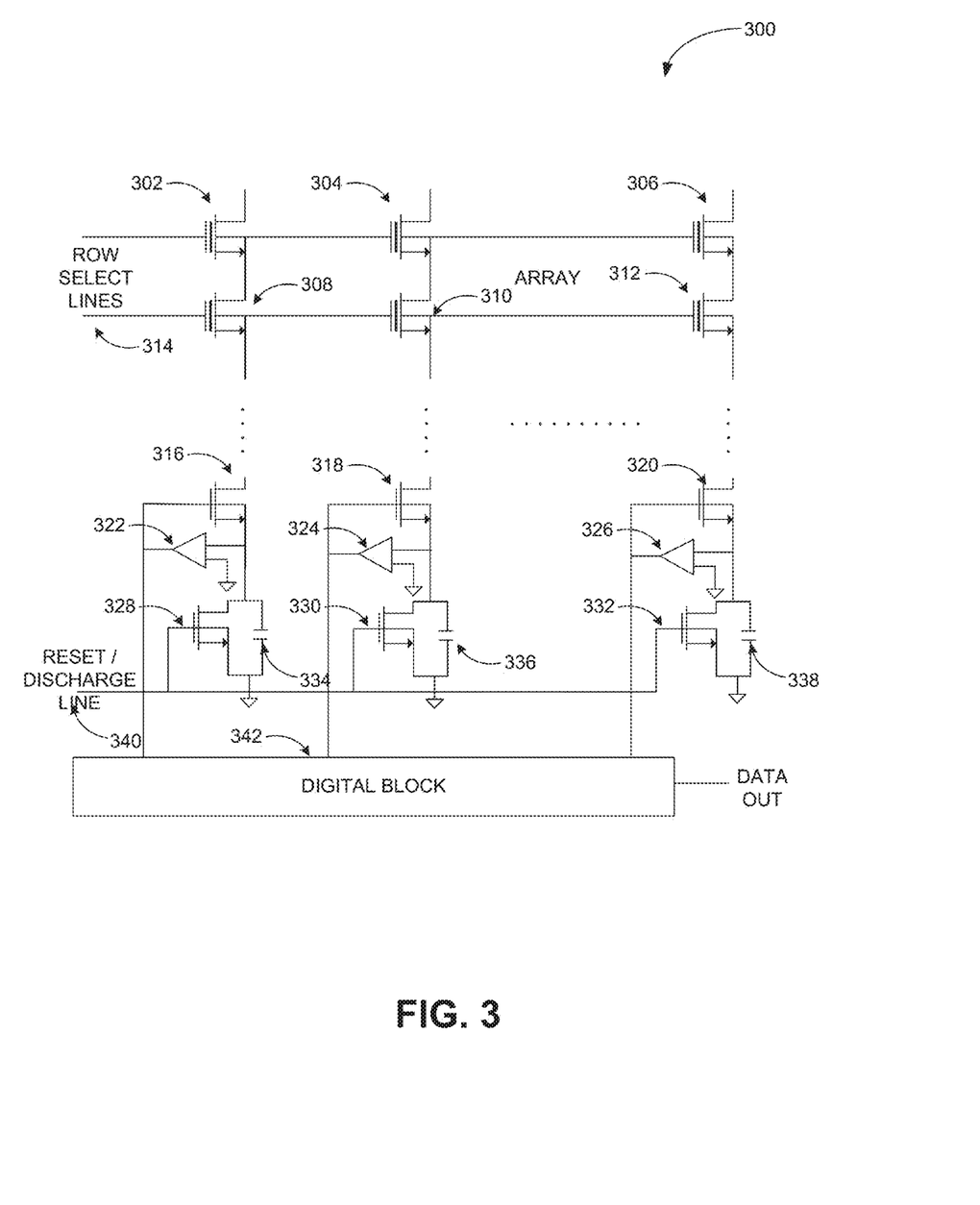
FIG. 3 schematically illustrates an example circuit architecture for determination of memory cell ranking.

FIG. 3 schematically illustrates an example circuit architecture for determination of memory cell ranking, arranged in accordance with at least some embodiments described herein, and coupled to a set.

An example architecture 300 in FIG. 3 corresponds to a flash memory as an illustrative example. The matrix configuration of the flash memory may include cells comprising floating gate N-channel Metal Oxide Semiconductor Field Effect Transistors (NMOS FETs) arranged in columns such as FETs 302, 308, etc. coupled to each other in the first column, FETs 304, 310, etc. coupled to each other in the second column, and FETs 306, 312, etc. coupled to each other in the last column. Row select lines 314 coupled to and for each row of FETs may enable selection of rows to initiate current flow (charging) into bit lines (columns) for each selected row. The terms column and bit line are used interchangeably herein. FETs 316, 318, 320, etc. coupled to and/or included in each column may be used to optionally turn off each column after the bit lines and the optional charge storage blocks (capacitors 334, 336, 338, etc. coupled to or included in each column) are charged to a pre-specified level. Sense amplifiers 322, 324, 326, etc. coupled to or included in each column may be used as current or voltage sense devices and are set to trigger at a pre-specified level. The last row of FETs 328, 330, 332, etc. may be coupled to the capacitors 334, 336, 338, etc. in parallel and may provide a connection to reset/discharge line 340. The sense devices (sense amplifiers 322, 324, 326, etc.) may be coupled to a digital block 342, which may provide the ranking of the cells as data out, among other functions or operations. While not shown in FIG. 3, the FETs 302, 304, 306. etc. may be further coupled to other devices such as high voltage (HV) FETs.

The architecture 300 shows a flash memory configuration to implement rank determination according to some embodiments, but embodiments may be implemented in other types of circuitry such as phase change memories, neural network circuitry, or other ones.

In a generalized configuration, the architecture 300 may include N-columns of flash cells, corresponding to bit lines, to be ranked through rank modulation. Ranking may begin with turning on the reset to discharge the bit lines (columns). Next, the selected row may be turned on, the unselected rows set at a bypass voltage, and current may begin to flow to charge the bit lines and the optional capacitors. This may result in the voltages on the bit lines rising. In some embodiments, the voltage on the row select line may be ramped in linear, staircase, or exponential or other manner in order to enhance a separation of the rank order. In other embodiments, the selected row may be enabled in a pulsed fashion to allow more time for the digital block to process data.

A column where the floating FET having the lowest threshold voltage (Vt) may rise the fastest and trigger the sense device (for example, a sense amplifier). While the sense device is shown as a sense amplifier (sense amplifiers 322, 324, 326) in the architecture 300 for illustrative purposes, other devices such as inverters may also be employed as sense devices. The level at which the sense amplifiers trigger may be adjustable. The triggering of the sense device may be recorded by the digital block (for example, a flip-flop may be triggered). The digital block may also store this rank and stream the data out. In further embodiments, feedback circuitry may be used to turn off the column. Remaining columns may keep on charging until the next sense circuitry triggers, etc. In yet other embodiments, the ranking data may be buffered and shifted out at the end of the sense period. In yet other embodiments, the voltage ramp rate on the row select line may be adaptive adjusted based on the condition of the digital block, including the status of the buffer and/or the status of the data streaming process. In yet further embodiments, a counter maybe employed to count the number of columns, which are triggered, and stop the reading process when all columns (except the last one) are completed.

Figure 4:
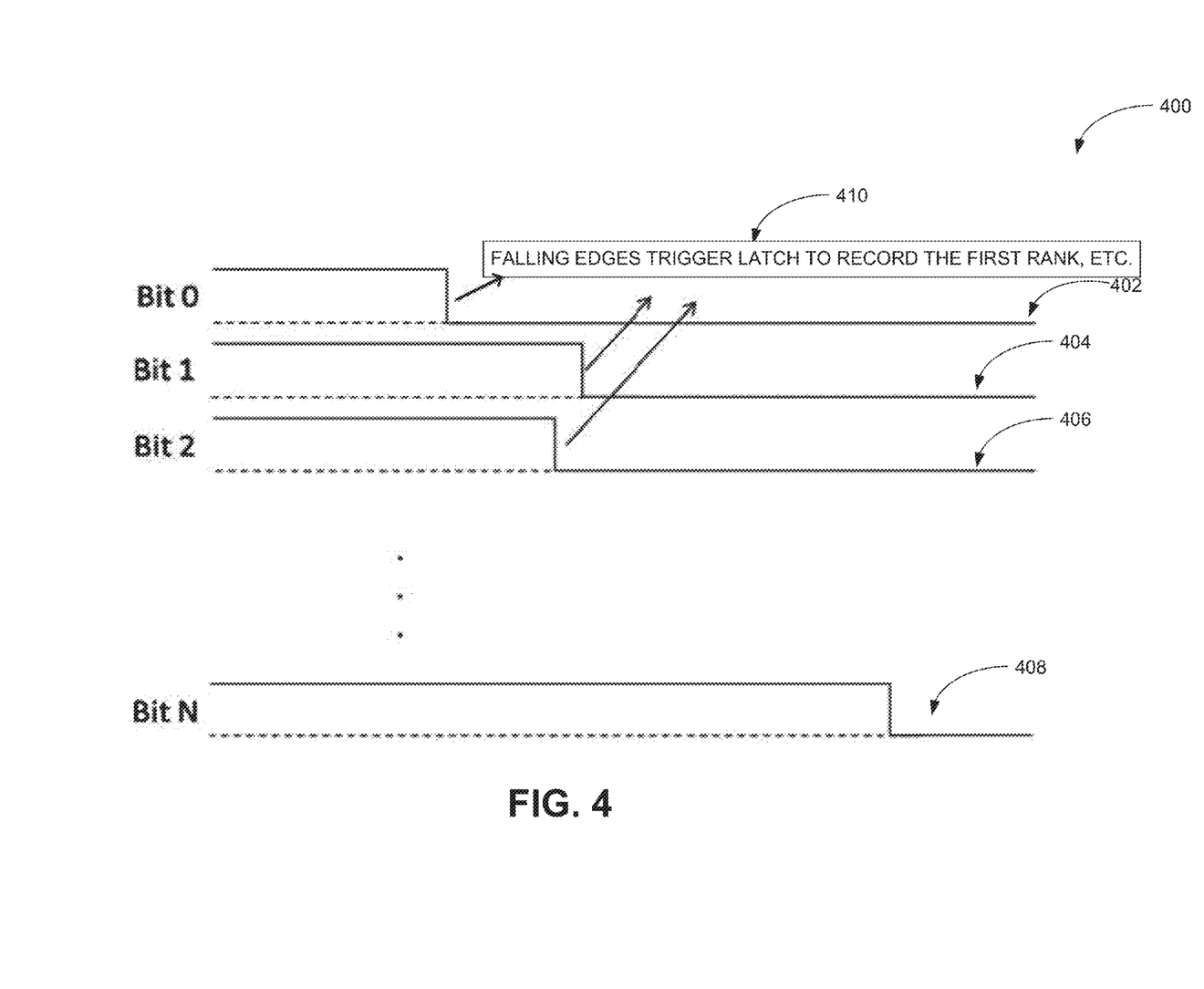
FIG. 4 illustrates example timing patterns of sense amplifiers in a memory ranking circuit.

FIG. 4 illustrates example timing patterns of sense amplifiers in a memory ranking circuit, arranged in accordance with at least some embodiments described herein.

Diagram 400 shows timing patterns of the bit lines (columns of the rank determination circuitry architecture 300 of FIG. 3) during sensing. As illustrated in a diagram 400, bit line data patterns 402, 404, 406, and 408 for bits 0, 1, 2, and N include a falling edge at different time points. The falling edges may trigger a latch to record the first rank, second rank, etc. (410) in the digital block 342 of FIG. 3, for example.

In the example pattern of diagram 400, the permutation is 1, 3, 2, . . . N because the third bit (bit 2) triggers before the second bit (bit 1). The capacitance of the charge storage capacitors 334, 336, and 338, together with the bit line capacitance and the capacitance of the sense circuitry (e.g., the sense amplifiers 322, 324, and 326 in FIG. 3) may determine a speed and resolution of this approach. Thus:

$C\text{total} = C\text{bit line} + C\text{capacitor} + C\text{sense\_amplifier}$ In an example implementation, the bit line current may be 0.2 µA for the slowest column, the total capacitance may be 1 pF, and the sense device may comprise a sense amplifier operating at 1 V and triggering at 0.5 V. In this example, the time to trigger the last sense amplifier may be:

$\Delta t = C\text{total} * V/I = 2.5 \ \mu s.$ 2.5 µs is much slower than typical digital circuitry operations and the digital circuitry may shift out the ranked data for many more than 40 cells in this time frame. The digital circuitry (e.g. digital block 342 of FIG. 3) may include shift registers and buffers in an example configuration and the data may be shifted out each time a column is triggered. Alternatively or additionally, multiple rows of buffers may be used to store the rank information and the decoding may be performed by the digital block 342. In some embodiments, the digital block 342 may be shared among different cell blocks to reduce overhead.

While embodiments have been discussed above using specific components, circuits, and configurations in FIG. 1, FIG. 2, FIG. 3, and FIG. 4, they are intended to provide examples to be used to determine ranking of memory cells or other types of circuitry. Other embodiments may be implemented using other components, schemes, and configurations using the examples described herein. For instance, other approaches may be implemented than those provided as example.

Figure 5:
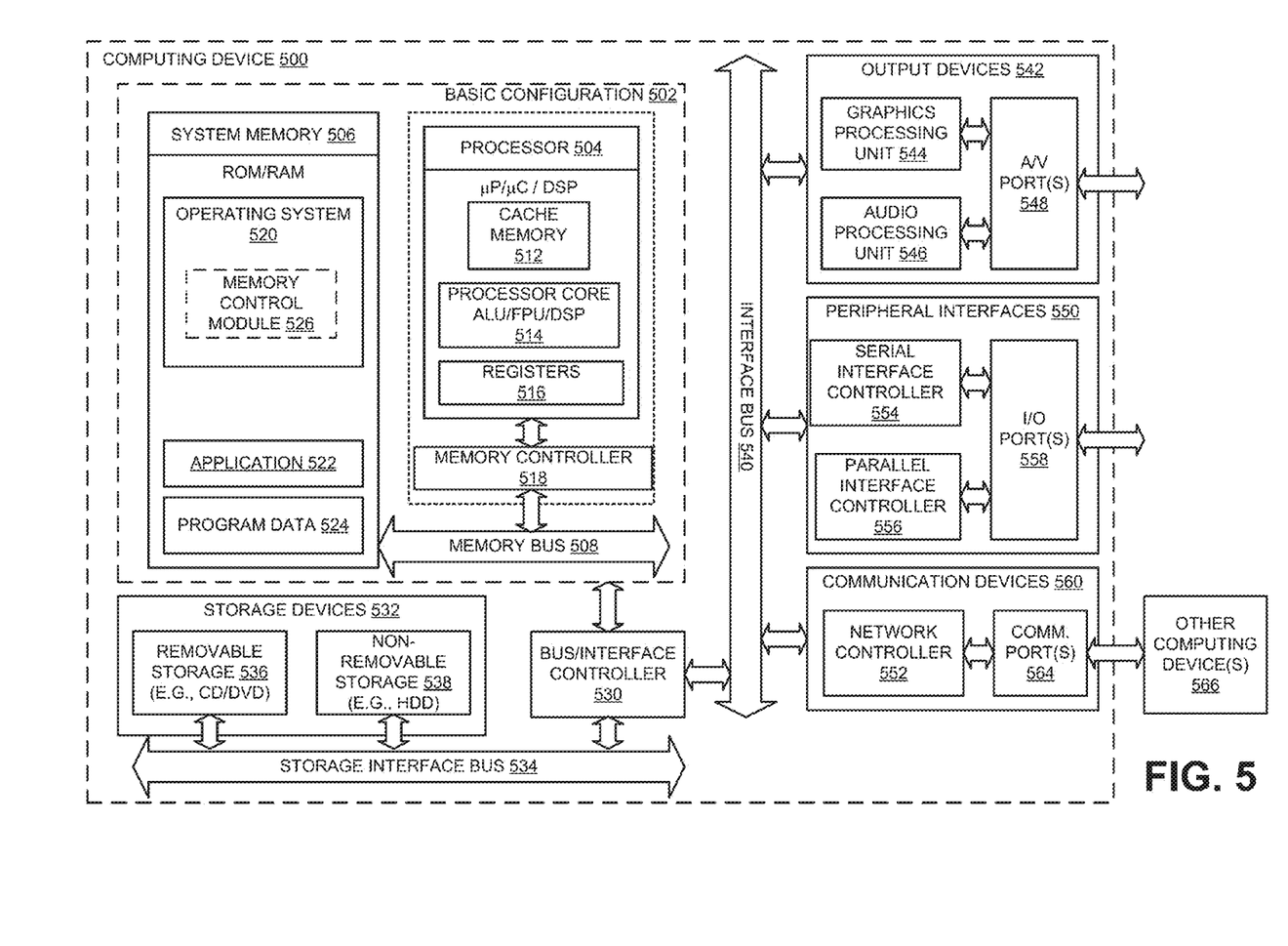
FIG. 5 illustrates a general purpose computing device, which may be used implement memory cell rank determination circuitry in use of various types of memories.

FIG. 5 illustrates a general purpose computing device, which may be used implement memory cell rank determination circuitry in use of various types of memories, arranged in accordance with at least some embodiments as described herein.

For example, a computing device 500 may be used as a server, desktop computer, portable computer, smart phone, special purpose computer, or similar device. In an example basic configuration 502, the computing device 500 may include one or more processors 504 and a system memory 506. A memory bus 508 may be used for communicating between the processor 504 and the system memory 506. The basic configuration 502 is illustrated in FIG. 4 by those components within the inner dashed line.

Depending on the desired configuration, the processor 504 may be of any type, including but not limited to a microprocessor (µP), a microcontroller (µC), a digital signal processor (DSP), or any combination thereof. The processor 504 may include one more levels of caching, such as a cache memory 512, one or more processor cores 514, and registers 516. The example processor cores 514 may (each) include an arithmetic logic unit (ALU), a floating point unit (FPU), a digital signal processing core (DSP core), or any combination thereof. An example memory controller 518 may also be used with the processor 504, or in some implementations, the memory controller 518 may be an internal part of the processor 504.

Depending on the desired configuration, the system memory 506 may be of any type including but not limited to volatile memory (such as RAM), non-volatile memory (such as ROM, flash memory, etc.) or any combination thereof. The system memory 506 may include an operating system 520, one or more applications 522, and program data 524. The operating system 520 may also include a memory control module 526, which may control operations of a digital block to rank memory cells in the flash memory (part of system memory 506) for example. Moreover any of the storage devices (such as the cache memory 512 and/or data storage devices 532) may implement the rank circuitry/methods described herein. Coder or decoder operations may be implemented in software and/or in hardware to convert data in binary representation into (or out of) of rank modulation data representation.

The computing device 500 may have additional features or functionality, and additional interfaces to facilitate communications between the basic configuration 502 and any desired devices and interfaces. For example, a bus/interface controller 530 may be used to facilitate communications between the basic configuration 502 and one or more data storage devices 532 via a storage interface bus 534. The data storage devices 532 may be one or more removable storage devices 536, one or more non-removable storage devices 538, or a combination thereof. Examples of the removable storage and the non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

The system memory 506, the removable storage devices 536 and the non-removable storage devices 538 are examples of computer storage media. Computer storage media includes, but is not limited to, RAM, ROM, EEPROM, flash memory or other memory technology, CD-ROM, digital versatile disks (DVDs), solid state drives, or other optical storage, magnetic cassettes, magnetic tape, magnetic disk storage or other magnetic storage devices, or any other medium which may be used to store the desired information and which may be accessed by the computing device 500. Any such computer storage media may be part of the computing device 500.

The computing device 500 may also include an interface bus 540 for facilitating communication from various interface devices (for example, one or more output devices 542, one or more peripheral interfaces 550, and one or more communication devices 560) to the basic configuration 502 via the bus/interface controller 530. Some of the example output devices 542 include a graphics processing unit 544 and an audio processing unit 546, which may be configured to communicate to various external devices such as a display or speakers via one or more A/V ports 548. One or more example peripheral interfaces 550 may include a serial interface controller 554 or a parallel interface controller 556, which may be configured to communicate with external devices such as input devices (for example, keyboard, mouse, pen, voice input device, touch input device, etc.) or other peripheral devices (for example, printer, scanner, etc.) via one or more I/O ports 558. An example communication device 560 includes a network controller 552, which may be arranged to facilitate communications with one or more other computing devices over a network communication link via one or more communication ports 564. The one or more other computing devices 566 may include servers, client devices, smart appliances, and comparable devices.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

The computing device 500 may be implemented as a part of a general purpose or specialized server, mainframe, or similar computer that includes any of the above functions. The computing device 500 may also be implemented as a personal computer including both laptop computer and non-laptop computer configurations.

Example embodiments may also include methods to determine ranks of multiple circuits such as memory cells. These methods can be implemented in any number of ways, including the structures described herein. One such way may be by machine operations, of devices of the type described in the present disclosure.

Figure 6:
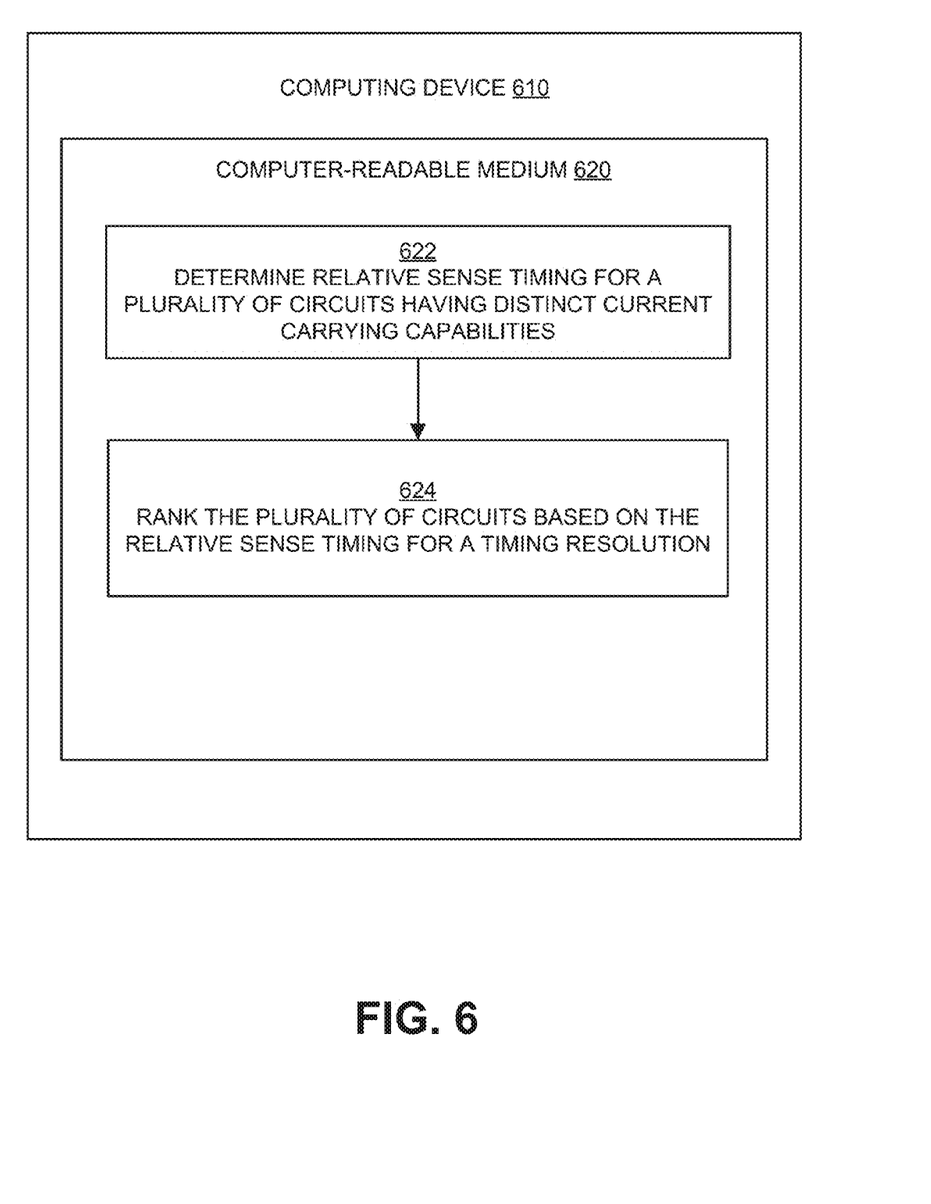
FIG. 6 is a flow diagram illustrating an example method to determine ranking of memory cells that may be performed by a computing device such as the computing device in FIG. 5.

FIG. 6 is a flow diagram illustrating an example method to determine ranking of memory cells that may be performed by a computing device such as the computing device in FIG. 5, arranged in accordance with at least some embodiments as described herein.

Example methods may include one or more operations, functions or actions as illustrated by one or more of blocks 622 and 624. The operations described in the blocks 622 through 624 may also be stored as computer-executable instructions in a computer-readable medium such as a non-transitory computer-readable medium 620 of a computing device 610. In one embodiment, the computing device 610 and the computer-readable medium 620 can be respectively embodied by the computing device 500 and the system memory 506 (and/or other storage devices) of FIG. 5.

An example process to determine rank of multiple circuits may begin with block 622, "DETERMINE RELATIVE SENSE TIMING FOR A PLURALITY OF CIRCUITS HAVING DISTINCT CURRENT CARRYING CAPABILITIES," where sense circuitry such as the sense amplifiers 322, 324, 326 may be used to sense timing of columns of memory cells.

Block 622 may be followed by block 624, "RANK THE PLURALITY OF CIRCUITS BASED ON THE RELATIVE SENSE TIMING FOR A TIMING RESOLUTION," where a digital block such as the digital block 342 may rank the memory cells based on the sense timing as described in more detail above.

The blocks included in the above described process are for illustration purposes. Determination of rank of multiple circuits may be implemented by similar processes with fewer or additional blocks. In some embodiments, the blocks may be performed in a different order. In some other embodiments, various blocks may be eliminated. In still other embodiments, various blocks may be divided into additional blocks, supplemented with other blocks, or combined together into fewer blocks.

Figure 7:
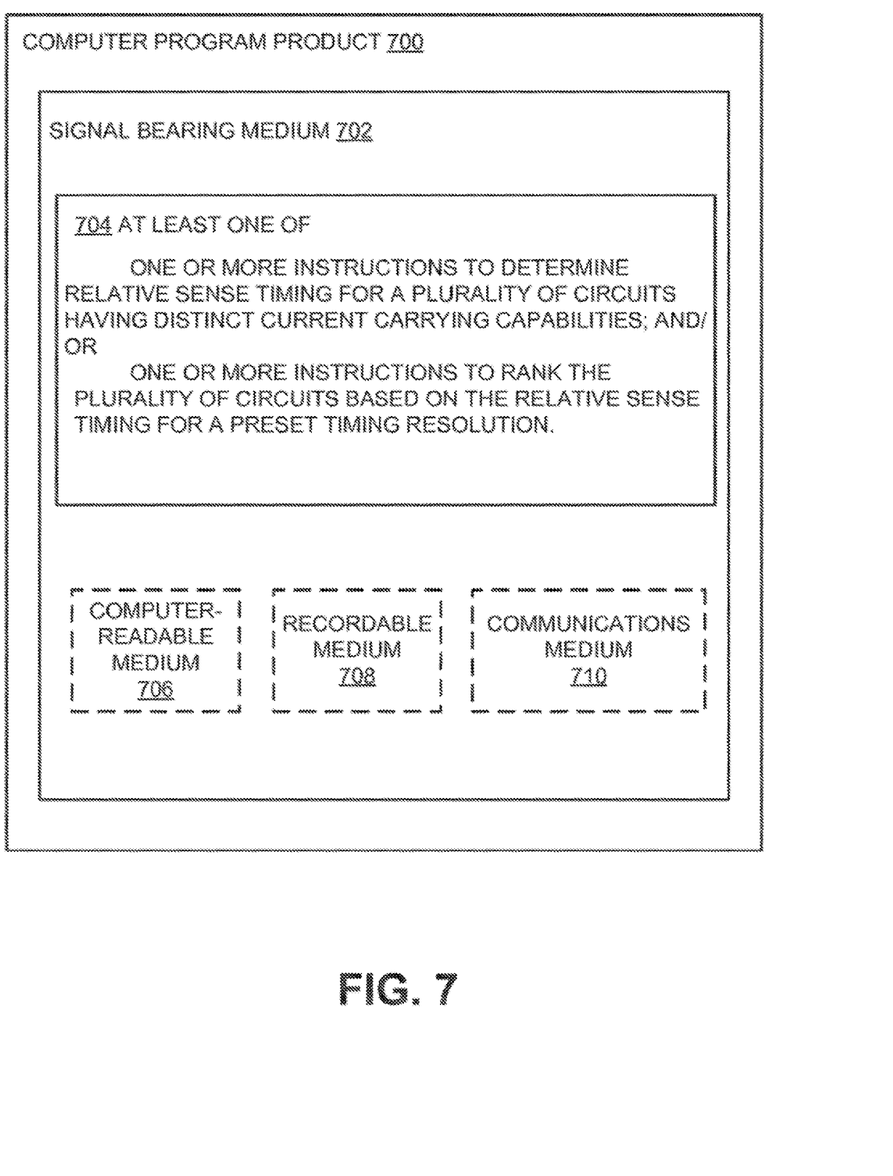
FIG. 7 illustrates a block diagram of an example computer program product, all arranged in accordance with at least some embodiments described herein.

FIG. 7 illustrates a block diagram of an example computer program product, arranged in accordance with at least some embodiments as described herein.

In some embodiments, as shown in FIG. 7, the computer program product 700 may include a signal bearing medium 702 that may also include one or more machine readable instructions 704 that, in response to execution by, for example, a processor may provide the functionality and features described above with respect to FIG. 5 and FIG. 6. Thus, for example, referring to the computing device 500 in FIG. 5, the memory control module 526 executed as part of the operating system 520 may undertake one or more of the tasks shown in FIG. 7 in response to the instructions 704 conveyed to the processor 504 by the signal bearing medium 702 to perform actions associated with rank determination as described herein. Some of those instructions may include, for example, one or more instructions to determine relative sense timing for a plurality of circuits having distinct current carrying capabilities and/or rank the plurality of circuits based on the relative sense timing for a preset timing resolution, according to some embodiments described herein.

In some implementations, the signal bearing medium 702 depicted in FIG. 7 may encompass a computer-readable medium 706, such as, but not limited to, a hard disk drive, a solid state drive, a Compact Disc (CD), a Digital Versatile Disk (DVD), a digital tape, memory, etc. In some implementations, the signal bearing medium 702 may encompass a recordable medium 708, such as, but not limited to, memory, read/write (R/W) CDs, R/W DVDs, etc. In some implementations, the signal bearing medium 702 may encompass a communications medium 710, such as, but not limited to, a digital and/or an analog communication medium (for example, a fiber optic cable, a waveguide, a wired communications link, a wireless communication link, etc.). Thus, for example, the computer program product 700 may be conveyed to one or more modules of the processor 504 of FIG. 5 by an RF signal bearing medium, where the signal bearing medium 702 may be conveyed by the wireless communications medium 710 (for example, a wireless communications medium conforming with the IEEE 802.11 standard).

According to some examples, the present disclosure describes methods to determine rank of a plurality of circuits. An example method may include determining relative sense timing for the plurality of circuits having distinct current carrying capabilities and ranking the plurality of circuits based on the determined relative sense timing for a timing resolution.

According to other examples, the method may further include setting the timing resolution through a control signal. Setting the timing resolution through the control signal may include using a particular gate voltage for each of the plurality of circuits by varying the gate voltage in one of a ramped, linear, or exponential manner and/or other manner. The method may also include employing a digital block to manage the control signal, and ranking the plurality of circuits may include using the digital block to rank the plurality of circuits, and wherein the digital block is shared among one or more groups of circuits.

According to further examples, the method may include buffering rank information and outputting through shifting out after completion of a sense period. Buffering the rank information may include employing a plurality of rows of buffers to store the rank information. The plurality of circuits may include one or more of flash memory cells, current sources, phase change memory circuitry, and neural network circuitry without an equivalent control gate to set the timing resolution.

The present disclosure also describes rank determination circuitry to determine rank of a plurality of circuits arranged in rows and columns. Example rank determination circuitry may include a sense block for each column of the plurality of circuits and a digital block. The sense block may be configured to sense a specific current level for a respective column of the plurality of circuits. The digital block may be configured to determine relative sense timing for the plurality of circuits through the sense blocks, where each of the plurality of circuits has a distinct current carrying capabilities, set a timing resolution using a particular control voltage for each of the plurality of circuits, and rank the plurality of circuits based on the determined relative sense timing at the set timing resolution.

According to some examples, the plurality of circuits may include one or more of flash memory cells, current sources, phase change memory circuitry, and neural network circuitry without an equivalent control gate to set the timing resolution. The digital block may also be configured to set the timing resolution by variation of the control voltage in one of a ramped, linear, or exponential manner. The digital block may be further configured to buffer rank information and output after completion of a sense period. The digital block may include a plurality of rows of buffers to store the rank information.

According to yet other examples, the digital block may be shared among one or more groups of circuits. The plurality of circuits may include flash memory cells and the digital block may be further configured to turn on a reset line to discharge bit lines to initiate the determination of the relative sensing timing and turn on a selected row such to enable current to flow to charge the bit lines.

According to yet further examples, the plurality of circuits may include flash memory cells and the digital block may also be configured to pre-charge bit lines to a set voltage value and initiate the determination of the relative sensing timing and turn on a selected row to enable current to flow to discharge the bit lines. The digital block may further vary a voltage applied to a row select line in one of a ramped, linear, or exponential manner. The digital block may also apply the voltage to the row select line in a pulsed manner.

According to some examples, the digital block may include a flip-flop circuit that is triggered by a fastest rising bit line voltage among the columns of flash memory cells. The digital block may also include feedback circuitry to turn off a sensed column. The digital block may be further configured to continue to charge remaining columns until a next sense block is triggered. The digital block may include counter circuitry to count a number of columns that are triggered and to stop to read after all columns are read. Each optional charge storage block may include a capacitor, and a value of the capacitor is selected based on a speed to read the columns. The bit line capacitance associated with the plurality of circuits may operate as at least one charge storage block. The digital block may include a row encoder to set the timing resolution.

According to further examples, the present disclosure also describes rank determination circuitry coupled to a matrix of flash memory cells. Example rank determination circuitry may include a sense block coupled to each column of flash memory cells and a digital block coupled to all rows and columns of flash memory cells. The sense block may be configured to sense a specific current level of a respective column. The digital block may be configured to turn on a reset line to discharge rows of flash memory cells to initiate a determination of a relative sense timing of the flash memory cells, select a row of the flash memory cells by ramping the row voltage and set the unselected rows to a bypass voltage, determine the relative sense timing based on detection of a fastest rising bit line voltage among columns of flash memory cells, and rank the flash memory cells based on information from the determined relative sense timing for the flash memory cells.

According to further examples, each flash memory cell may optionally include a charge storage block coupled to each column of the flash memory cells, each charge storage block including a floating gate Field Effect Transistor (FET). Each charge storage block may also include a FET and a capacitor coupled to the FET, and a value of the capacitor may be selected based on a speed to read the columns of the flash memory cells. The rank determination circuitry may further include a switch coupled to each column, where each switch is configured to turn off its respective column after the bit line is charged to a specified level. The digital block may be further configured to continue to charge remaining columns until a next sense block is triggered. The digital block may also be configured to select the row of the flash memory cells by variation of a voltage applied to a row select line in one of a ramped, linear, pulsed, or exponential manner.

The use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (for example, hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, some aspects of the embodiments disclosed herein, in whole or in part, may be equivalently implemented in integrated circuits, as one or more computer programs running on one or more computers (for example, as one or more programs running on one or more computer systems), as one or more programs running on one or more processors (for example as one or more programs running on one or more microprocessors), as firmware, or as virtually any combination thereof, and that designing the circuitry and/or writing the code for the software and or firmware are possible in light of this disclosure.

The present disclosure is not to be limited in terms of the particular embodiments described in this application, which are intended as illustrations of various aspects. Many modifications and variations can be made without departing from its spirit and scope. Functionally equivalent techniques and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

In addition, the mechanisms of the subject matter described herein are capable of being distributed as a program product in a variety of forms, and an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Versatile Disk (DVD), a digital tape, a computer memory, etc.; and a transmission type medium such as a digital and/or an analog communication medium (for example, a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. A typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors.

A typical data processing system may be implemented using any suitable commercially available components, such as those typically found in data computing/communication and/or network computing/communication systems. The herein described subject matter sometimes illustrates different components contained within, or connected with, different other components. Such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone. C alone, A and B together. A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various compositions, techniques, systems, and devices are described in terms of "comprising" various components or steps (interpreted as meaning "including, but not limited to"), the compositions, techniques, systems, and devices can also "consist essentially of" or "consist of" the various components and steps, and such terminology should be interpreted as defining essentially closed-member groups.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to." "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method to determine rank of a plurality of circuits, the method comprising:
    determining relative sense timing for the plurality of circuits, which have distinct current carrying capabilities, by:
        turning on a reset line to discharge bit lines corresponding to columns of flash memory cells within the plurality of circuits,
        applying a voltage to a selected row of the flash memory cells and setting a pass voltage to unselected rows of the flash memory cells such that current flows to charge the columns of the flash memory cells, and
        detecting a column, among the columns of the flash memory cells, corresponding to a fastest rising bit line voltage in response to the column triggering a sense device, wherein a counter circuit is configured to count a number of the columns that have triggered the sense device such that a reading process is stopped after each of the columns, except for a last column, have triggered the sense device, wherein the reading process is performed by a charge storage block for each column of the plurality of circuits and coupled to the plurality of circuits, and wherein a speed of the reading process is determined based on a value of a capacitor included in each charge storage block;
    ranking the plurality of circuits based on the determined relative sense timing for a timing resolution;

storing rank information, associated with the ranking of the plurality of circuits, in a plurality of rows of buffers; and shifting the rank information out from the plurality of rows of buffers in response to a completion of one sense period.

2. The method of claim 1, further comprising setting the timing resolution using a particular gate voltage for each of the plurality of circuits by varying the gate voltage in one of a ramped, linear, or exponential manner through a control signal.

3. The method of claim 2, further comprising:

employing a digital block to manage the control signal, and wherein ranking the plurality of circuits includes using the digital block to rank the plurality of circuits, and wherein the digital block is shared among one or more groups of circuits.

4. Rank determination circuitry to determine rank of a plurality of circuits arranged in rows and columns, the rank determination circuitry comprising:

a sense block for each column of flash memory cells within the plurality of circuits and coupled to the plurality of circuits, the sense block configured to sense a specific current or voltage level for a respective column of the flash memory cells;

a digital block coupled to the sense blocks, and configured to:

determine relative sense timing for the plurality of circuits through the sense blocks, wherein each of the plurality of circuits has a distinct current carrying capability, and wherein the digital block is configured to determine the relative sense timing by:

turn on of a reset line to discharge bit lines corresponding to columns of the flash memory cells, application of a voltage to a selected row of the flash memory cells and setting of a pass voltage to unselected rows of the flash memory cells such that current flows to charge the columns of the flash memory cells, and detection of a column, among the columns of the flash memory cells, corresponding to a fastest rising bit line voltage in response to the column having triggered a respective sense block, wherein a counter circuit is configured to count a number of the columns that have triggered respective sense blocks such that a read process is stopped after each of the columns, except for a last column, have triggered the respective sense blocks;

set a timing resolution using a particular control voltage for each of the plurality of circuits;

rank the plurality of circuits based on the determined relative sense timing for the set timing resolution;

store rank information associated with the rank of the plurality of circuits in a plurality of rows of buffers; and shift the rank information out from the plurality of rows of buffers in response to a completion of one sense period; and a charge storage block for each column of the plurality of circuits and coupled to the plurality of circuits, each charge storage block including a capacitor, and wherein a value of the capacitor is selected based on a speed to read each column of the plurality of circuits.

5. The rank determination circuitry of claim 4, wherein the plurality of circuits include one or more of current sources, phase change memory circuitry, and neural network circuitry without an equivalent control gate to set the timing resolution.

6. The rank determination circuitry of claim 4, wherein the digital block is further configured to:

pre-charge bit lines corresponding to the columns of the flash memory cells to a set voltage value; and turn on the selected row of the flash memory cells and set the pass voltage to the unselected rows of the flash memory cells to enable current to flow to discharge the pre-charged bit lines.

7. The rank determination circuitry of claim 4, wherein the digital block is further configured to:

vary the voltage applied to the selected row of the flash memory cells in one of a ramped, linear, or exponential manner, wherein the voltage level is adaptively adjusted based on a status of the digital block including a status of the buffers within the digital block.

8. The rank determination circuitry of claim 4, wherein the digital block includes a flip-flop circuit that is configured to be triggered by the fastest rising bit line voltage among the columns of the flash memory cells.

9. The rank determination circuitry of claim 4, wherein the digital block includes feedback circuitry to turn off a column of the flash memory cells in response to the column having triggered the respective sense block.

10. The rank determination circuitry of claim 4, wherein bit line capacitance associated with the plurality of circuits operates as at least one charge storage block.

11. The rank determination circuitry of claim 4, wherein the digital block includes a row encoder to set the timing resolution.

12. Rank determination circuitry coupled to a matrix of flash memory cells, the rank determination circuitry comprising:

a sense block coupled to each column of the flash memory cells, wherein the sense block is configured to sense a specific current or voltage level of a respective column;

a digital block coupled to the sense block and all rows and columns of the flash memory cells, wherein the digital block is configured to:

turn on a reset line to discharge bit lines corresponding to the columns of the flash memory cells to initiate a determination of a relative sense timing for the flash memory cells;

apply a voltage to a selected row of the flash memory cells and set a pass voltage to unselected rows of the flash memory cells such that current flows to charge the columns of the flash memory cells;

determine the relative sense timing based on detection of a column, among the columns of flash memory cells, corresponding to a fastest rising bit line voltage in response to the column having triggered a respective sense block, wherein a counter circuit is configured to count a number of the columns that have triggered respective sense blocks such that a read process is stopped after each of the columns, except for a last column, have triggered the respective sense blocks;

rank the flash memory cells based on information from the determined relative sense timing for the flash memory cells;

store rank information associated with the rank of the flash memory cells in a plurality of rows of buffers; and shift out the rank information from the plurality of rows of buffers in response to a completion of one sense period; and a charge storage block coupled to each column of the flash memory cells, wherein each charge storage block includes a field effect transistor (FET) and a capacitor coupled to the FET, and wherein a value of the capacitor is selected based on a speed to read each column of the flash memory cells.

13. The rank determination circuitry of claim 12, wherein each flash memory cell comprises a floating gate field effect transistor (FET).

14. The rank determination circuitry of claim 12, further comprising a switch coupled to each column of the flash memory cells, wherein each switch is configured to turn off its respective column of the flash memory cells after a corresponding capacitor of the charge storage block is charged.

15. The rank determination circuitry of claim 12, wherein the digital block is further configured to:
continue to charge remaining columns of the flash memory cells until a next sense block is triggered.

16. The rank determination circuitry of claim 12, wherein the digital block is configured to select the row of the flash memory cells by variation of the voltage applied to a row select line in one of a ramped, linear, pulsed, or exponential manner.

* * * * *

UNITED STATES PATENT AND TRADEMARK OFFICE
CERTIFICATE OF CORRECTION

PATENT NO. : 9,589,654 B2  Page 1 of 1
APPLICATION NO. : 14/647075
DATED : March 7, 2017
INVENTOR(S) : Ma et al.

It is certified that error appears in the above-identified patent and that said Letters Patent is hereby corrected as shown below:

In the Specification

In Column 1, Line 9, delete "§371" and insert -- § 371 --, therefor.

In Column 5, Line 26, delete "302, 304, 306." and insert -- 302, 304, 306, --, therefor.

In Column 13, Line 61, delete "B alone. C alone, A and B together. A and C" and insert -- B alone, C alone, A and B together, A and C --, therefor.

In Column 14, Line 22, delete ""up to."" and insert -- "up to," --, therefor.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*